(12) United States Patent
Mahadevan et al.

(10) Patent No.: US 8,829,982 B2
(45) Date of Patent: Sep. 9, 2014

(54) SYSTEM INCORPORATING POWER SUPPLY REJECTION CIRCUITRY AND RELATED METHOD

(75) Inventors: Rajeevan Mahadevan, Toronto (CA); Antonios Pialis, Scarborough (CA); Robert Wang, Whitby (CA); Navid Yaghini, Pickering (CA); Rafal Karakiewicz, Toronto (CA); Raymond Kwok Kei Tang, Thornhill (CA); Sida Shen, North York (CA); Mark Andruchow, Toronto (CA); Zhuobin Li, Toronto (CA); Nicola Pantaleo, Toronto (CA)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/543,982

(22) Filed: Jul. 9, 2012

(65) Prior Publication Data

US 2013/0027119 A1    Jan. 31, 2013

Related U.S. Application Data

(60) Provisional application No. 61/512,549, filed on Jul. 28, 2011.

(51) Int. Cl.
  G05F 1/10    (2006.01)
  H03L 7/089   (2006.01)
  H03L 7/091   (2006.01)

(52) U.S. Cl.
  CPC .............. *H03L 7/0891* (2013.01); *H03L 7/091* (2013.01)
  USPC ........................... 327/538; 327/531; 327/532

(58) Field of Classification Search
  USPC ......... 327/538, 530, 531, 532, 540, 541, 543, 327/551, 558, 156, 159
  See application file for complete search history.

(56) References Cited

U.S. PATENT DOCUMENTS

| | | | |
|---|---|---|---|
| 5,767,713 A | 6/1998 | Williams | |
| 5,802,123 A | 9/1998 | Yoshimura et al. | |
| 5,912,575 A * | 6/1999 | Takikawa | ...................... 327/157 |

(Continued)

OTHER PUBLICATIONS

Loke, et al., "A Versatile Low-Jitter PLL in 90-nm CMOS for SerDes Transmitter Clocking" IEEE 2005 Custom Integrated Circuits Conference, p. 553-556.

(Continued)

*Primary Examiner* — Lincoln Donovan
*Assistant Examiner* — Jung H Kim
(74) *Attorney, Agent, or Firm* — Blakely, Sokoloff, Taylor & Zafman LLP

(57) ABSTRACT

A system and method providing power supply rejection. One embodiment provides for power supply rejection in PLL or DLL circuitry. First subcircuitry provides second subcircuitry a supply voltage which is a filtered version of power from an external source. The first subcircuitry includes a first field effect transistor and a first low pass filter coupled to receive a signal from the external power source during operation of the second subcircuitry. The filter is coupled to provide a filtered version of the power source signal to the gate of the first transistor, so that when a first source/drain region of the first transistor is connected to receive power from the external source and the gate of the first transistor receives the filtered version of the power source signal, the second source/drain region of the first transistor provides a first modified version of the power received from the external source.

16 Claims, 9 Drawing Sheets

(56) References Cited

U.S. PATENT DOCUMENTS

| | | | |
|---|---|---|---|
| 5,920,488 | A | 7/1999 | Arnold et al. |
| 5,978,425 | A | 11/1999 | Takla |
| 6,242,956 | B1 | 6/2001 | McCollough et al. |
| 6,441,660 | B1* | 8/2002 | Ingino, Jr. .................. 327/156 |
| 6,509,727 | B2* | 1/2003 | Fahrenbruch ................ 323/316 |
| 6,690,240 | B2 | 2/2004 | Maxim et al. |
| 6,747,497 | B2* | 6/2004 | Ingino, Jr. .................... 327/157 |
| 6,778,005 | B2* | 8/2004 | Fujiwara et al. ............. 327/538 |
| 6,998,923 | B2 | 2/2006 | Melanson |
| 7,102,403 | B2 | 9/2006 | Wang |
| 7,177,611 | B2 | 2/2007 | Goldman |
| 7,203,261 | B2 | 4/2007 | Gupta |
| 7,382,201 | B1 | 6/2008 | Yu |
| 7,432,751 | B2 | 10/2008 | Fang |
| 7,580,497 | B2 | 8/2009 | Wang et al. |
| 7,642,822 | B2 | 1/2010 | Baker et al. |
| 7,755,413 | B2 | 7/2010 | Wong |
| 7,782,104 | B2 | 8/2010 | Madoglio et al. |
| 7,825,708 | B2 | 11/2010 | Thomsen et al. |
| 8,067,965 | B2 | 11/2011 | Wei et al. |
| 8,170,169 | B2 | 5/2012 | Martin et al. |
| 8,339,165 | B2 | 12/2012 | Dunworth et al. |
| 2003/0169099 | A1* | 9/2003 | Fujiwara et al. ............. 327/543 |
| 2006/0244490 | A1 | 11/2006 | Ha et al. |
| 2007/0018699 | A1 | 1/2007 | Abbasi |
| 2007/0165708 | A1 | 7/2007 | Darabi et al. |
| 2008/0068056 | A1* | 3/2008 | Poulton et al. ................ 327/156 |
| 2009/0085679 | A1 | 4/2009 | Jennings et al. |
| 2009/0231002 | A1* | 9/2009 | Poulton et al. ................ 327/156 |
| 2011/0025385 | A1* | 2/2011 | Poulton et al. ................ 327/156 |
| 2011/0309888 | A1 | 12/2011 | Bulzacchelli et al. |
| 2011/0311080 | A1* | 12/2011 | Jaar et al. ...................... 381/174 |
| 2013/0027096 | A1 | 1/2013 | Pialis et al. |
| 2013/0027097 | A1 | 1/2013 | Wang et al. |
| 2013/0027098 | A1 | 1/2013 | Wang et al. |
| 2013/0027099 | A1 | 1/2013 | Wang et al. |
| 2013/0027100 | A1 | 1/2013 | Yaghini et al. |
| 2013/0027119 | A1 | 1/2013 | Mahadevan et al. |

OTHER PUBLICATIONS

Curtain, et al, "Phase Locked Loops for High-Frequency Receivers and Transmitters—Part 1", Analog Dialogue, vol. 33, No. 3, 1999, p. 1-9.

Curtain, et al, "Phase Locked Loops for High-Frequency Receivers and Transmitters—Part 2", Analog Dialogue, vol. 33, No. 5, 1999, p. 1-5.

Curtain, et al, Phase Locked Loops for High-Frequency Receivers and Transmitters—Part 3, Analog Dialogue, vol. 33, No. 7, 1999, p. 1-5.

Vanroon, "Phased Locked Loops", www.uoguelph.com, 2001, p. 1-11.

Notice of Allowance issued for U.S. Appl. No. 13/543,991, mailed Oct. 9, 2013, 13 pages.

Notice of Allowance mailed on Dec. 28, 2012 for U.S. Appl. No. 13/543,961, 9 pages.

Non-Final Office Action mailed Feb. 19, 2013 for U.S. Appl. No. 13/544,001, 15 pages.

Non-Final Office Action mailed Feb. 21, 2013 for U.S. Appl. No. 13/543,971, 16 pages.

International Search Report issued for International Patent Application No. PCT/US12/46027, mailed Dec. 6, 2012.

Non-Final Office Action issued for U.S. Appl. No. 13/543,975, mailed Apr. 19, 2013.

Non-Final Office Action issued for U.S. Appl. No. 13/543,991, mailed Jun. 3, 2013.

Notice of Allowance issued for U.S. Appl. No. 13/544,001, mailed Apr. 5, 2013.

Notice of Allowance issued for U.S. Appl. No. 13/543,971, mailed Apr. 11, 2013.

Notice of Allowance issued for U.S. Appl. No. 13/543,975, mailed Jul. 5, 2013.

Notification Concerning Transmittal of International Preliminary Report on Patentability issued for International Patent Application No. PCT/US2012/046027, mailed Feb. 6, 2014, 13 pages.

\* cited by examiner

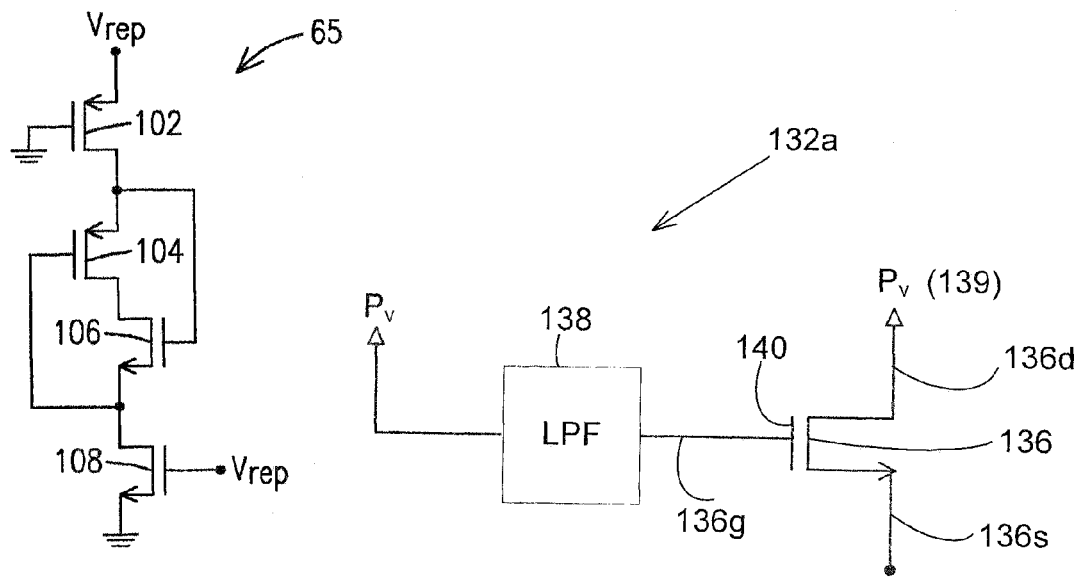
FIG. 10
FIG. 12
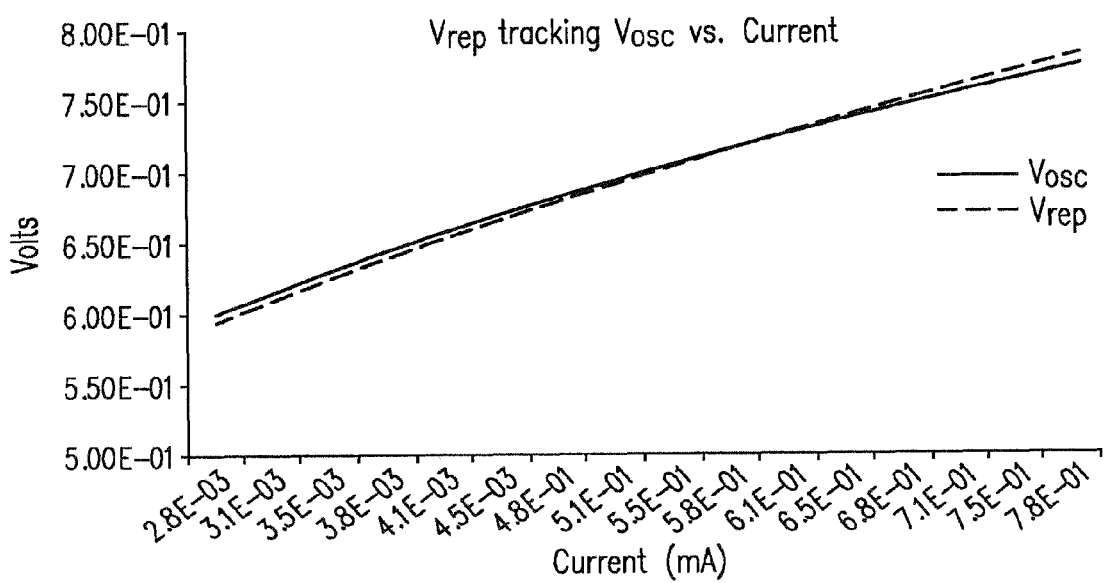
FIG. 11

SYSTEM INCORPORATING POWER SUPPLY REJECTION CIRCUITRY AND RELATED METHOD

PRIORITY BASED ON RELATED APPLICATION

This application claims priority based on U.S. Provisional Application No. 61/512,549 filed 28 Jul. 2011.

FIELD OF THE INVENTION

The present invention relates to electronic systems which incorporate power supply rejection. In one series of embodiments circuits and methods are provided for achieving power supply rejection in phase locked loop or delay locked loop circuitry.

BACKGROUND

The phase locked loop (PLL) circuit is a feedback control circuit which may be analog or digital. A phase detector develops an adjustment signal based on comparison between the output of a local voltage controlled oscillator (VCO) and a reference clock input signal. The adjustment signal is processed to provide a modified input to the VCO which results in a phase or frequency modification to the oscillator output signal. Phase locked loop circuits are common building blocks in custom integrated circuitry providing, for example, synchronization solutions in a wide variety of gigaHertz (GHz) rate data communications applications. However, in some applications, such as cellular communications base stations, high speed precision has required use of discrete components.

Conventionally, PLL's can be categorized as analog or digital, but numerous variants exist, including the combination of digital phase detection with the phase detection output processed through a charge pump and an analog loop filter to provide a voltage input to the VCO. As is well known, a charge pump comprises switches which control charging of the capacitor in the loop filter to accumulate charge. See FIG. 1. A full digital PLL solution comprises a digital phase detector, a digital filter and a numerically controlled oscillator. Both analog and digital implementations typically generate a proportional component and an integral component for, respectively, delivering phase and frequency feedback control to the oscillator.

FIG. 1A is a high level diagram of a conventional PLL incorporating a charge pump an analog loop filter and a transconductance ($G_m$) amplifier as more fully illustrated in FIG. 1B. A phase-frequency detector (PFD) receives a reference clock input signal of desired frequency and a feedback signal from a VCO. The PFD may be one of numerous designs, including types based on exclusive OR gates or flip flops, which output a pulse signal proportional to positive or negative phase and frequency differences between the clock signal and the feedback signal.

In the past, it has been necessary to provide the charge pump, loop filter, and $G_m$ amplifier to translate the full swing up and down signals from the PFD to the VCO. The signals from the PFD turn switches in the charge pump on and off to provide currents, creating a voltage differential, $\Delta V$, across the resistor R. This small signal voltage, $\Delta V$, is then passed into the $G_m$ amplifier, sometimes referred to as a voltage to current converter. The current output from the $G_m$ goes into the VCO. Through this process, gain is realized through the product of the charge pump current and resistance of R, as well as operation of the $G_m$ amplifier. However, the analog PLL requires a large passive device in a monolithic process and results in a path for noise to enter the VCO.

The VCO may be a three stage ring oscillator circuit having three inverters $I_1$, $I_2$, $I_3$ coupled in series as shown in FIG. 1C. Assuming a predetermined bias voltage, the circuit oscillates at a frequency, f, having an associated period 1/f. For this three stage ring, the group delay (or the phase shift) of all 3 stages is 360 degrees. Hence, this means each stage $I_1$, $I_2$, $I_3$ has a delay of 120 degrees and, due to the phase shift, the nodes labeled $N_1$, $N_2$, $N_3$ will be at different potentials at any instant in time. For example, when one of the nodes is close to $V_{DD}$, another node will be close to ground ($V_{SS}$) and the other node will be at a potential between $V_{DD}$ and ground.

Generally, the desired VCO frequency, f, is a multiple, N, of the reference clock signal frequency, and is factored by the block DIV/N accordingly to provide the suitable feedback signal for comparison to be made by the PFD. This results in a phase difference output signal which may comprise a pulse width having a time duration in proportion to the phase difference. A charge pump receives the phase difference output signal and generates current in proportion to the phase difference. The current output by the charge pump is fed through an analog loop filter to the VCO. The design of the loop filter affects response time, bandwidth and stability. The combination of the charge pump and the loop filter provides two components of signal to the VCO: a pulse component in proportion to the phase difference, and an integral component which affects the frequency adjustment.

An advantage of the analog PLL is low jitter. However, with increased demands for higher speed precision, even the relatively low noise analog PLL implementations considered acceptable at lower data rates may be too noise sensitive in some gigahertz data communications. For example, tuning of the loop filter component for a desired response time and stability in an analog PLL can still result in added noise. Generally, it is desirable to develop designs which further reduce the impact of noise sources. Another limitation of analog PLL circuits is that the analog charge pumps and loop filters have wide range voltage tuning requirements. These are becoming increasingly difficult to meet as manufacturing technologies have moved past the 45 nanometer node to 28 nm technologies and toward, for example, 10 nm linewidths. When fabricating analog PLLs in deep nanometer technologies there are also concerns about relatively high capacitor leakage rates and, generally, disadvantages due to an inability to scale the sizes of analog components with the smaller digital components.

FIG. 2 illustrates an example of an all digital PLL. Common to all fully digital PLLs, analog circuit blocks are replaced by converting signals received from the PFD into digital signals, using quantizers or analog-to-digital converters. In lieu of a charge pump and an analog loop filter, the digital implementation performs digital conversions of the output signals generated by the PFD. Elimination of the capacitor permits better scaling to small fabrication geometries and reduces sensitivity to process variations. The illustrated digital PLL has a proportional path, for adjusting the phase of the VCO, which is distinct from a frequency adjusting integral path. The proportional and integral paths undergo separate digital-to-analog conversions for input to the VCO because they each may require conversion of a different number of bits. Advantageously, elimination of the analog charge pump and analog loop filter enhances scalability and avoids sensitivity problems which analog components exhibit to minor process variations. On the other hand, quantization of the proportional and integral tuning paths introduces jitter, e.g., static phase offset, which precludes use of digital PLLs when timing precision is essential.

SUMMARY OF THE INVENTION

According to an embodiment of the invention an electronic system includes first subcircuitry and second subcircuitry. The first subcircuitry is positioned to provide to the second subcircuitry a supply voltage which is a filtered version of power available from an external power source. The first subcircuitry includes a first field effect transistor and a first low pass filter. The first field effect transistor has first and second source/drain regions and a gate region. The first low pass filter is coupled to receive a signal from the external power source during operation of the second subcircuitry. The first filter is also coupled to provide a filtered version of the power source signal to the gate of the first transistor, so that when the first source/drain region of the first transistor is connected to receive power from the external source, and the gate of the first transistor receives the filtered version of the power source signal, the second source/drain region of the first transistor provides a first modified version of the power received from the power source.

In one implementation the phase locked loop circuitry includes fast integral path circuitry, slow integral circuit path circuitry and proportional path circuitry. In a related embodiment the system comprises serialization or deserialization circuitry with second subcircuitry including a phase locked loop circuit as a component of the serialization or deserialization circuitry.

BRIEF DESCRIPTION OF THE DRAWINGS

Features of the invention will be best understood when the following detailed description is read in conjunction with the accompanying drawings wherein:

FIG. 10 illustrates an embodiment of a replica circuit 65 having impedance characteristics which suitably match the characteristics of a VCO;

FIG. 11 provides a graphic comparison between voltage-current characteristics of the replica circuit of FIG. 10 and voltage-current characteristics of a VCO;

FIGS. 12-14 illustrate example embodiments of the power supply rejection circuitry of FIG. 6B.

Like reference numbers are used throughout the figures to denote like components. Numerous components are illustrated schematically, it being understood that various details, connections and components of an apparent nature are not shown in order to emphasize features of the invention. Various features shown in the figures are not shown to scale in order to emphasize features of the invention.

DETAILED DESCRIPTION

Figure 3:
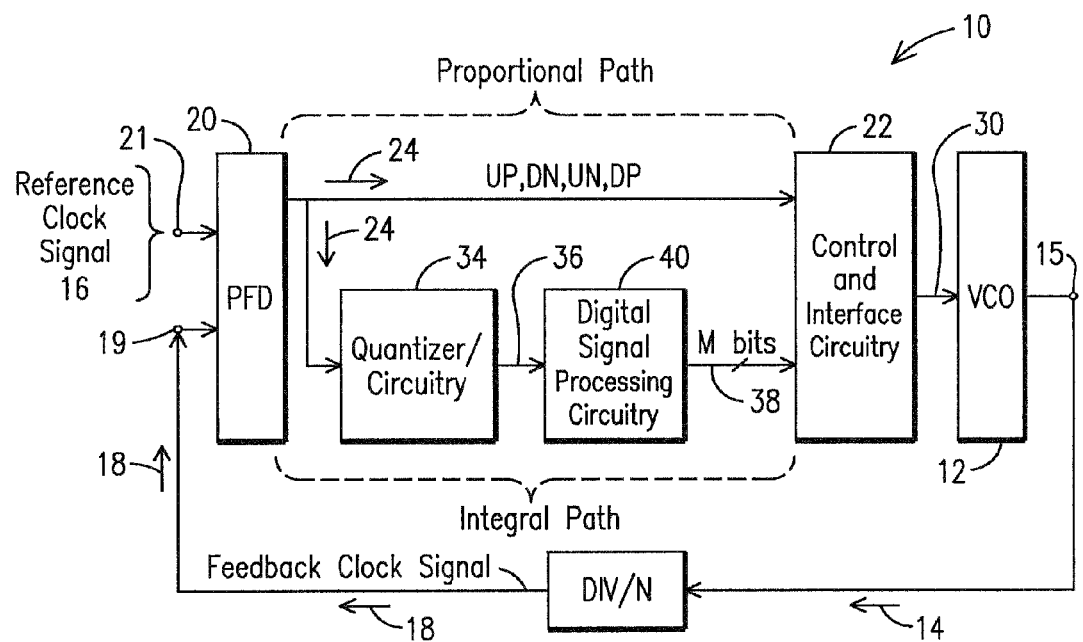
FIG. 3 illustrates a phase locked loop circuit according to an embodiment of the invention.

FIG. 3 illustrates a phase locked loop (PLL) circuit 10 according to an embodiment of the invention. A voltage controlled oscillator (VCO) 12 outputs a signal 14 at a terminal 15 thereof, the phase and frequency of which are adjustable based on a comparison between the signal 14 and a clock reference signal 16. The VCO 12 may be the ring oscillator circuit shown in FIG. 1C. In this example, the desired frequency of the signal 14 is a multiple N of the reference clock signal frequency. To effect phase and frequency control of the VCO 12, a portion of the output signal 14 is factored with divide by N circuitry (DIV/N) 17 to provide a feedback signal 18 as an input to a terminal 19 of a Phase-Frequency Detector (PFD) 20. The reference clock signal 16 is provided as an input to a terminal 21 of the PFD 20.

Control and interface circuitry 22, positioned between the VCO 12 and the PFD 20, receives inputs both directly and indirectly from the output signal 24 of the PFD 20, which is in analog form, to provide the VCO 12 with a combination of input signals. In the illustrated embodiment the input signals to the control and interface circuitry 22 are a combination of the analog version (i.e., the output signal 24) and a digitized version of the output signal 24. Based on the combination of The control and interface Operation of the circuitry 22 is controlled with both an analog version and a digital version of the PFD output signal 24 to provide multiple input adjustment signals 30 to the VCO 12.

Figure 6A:
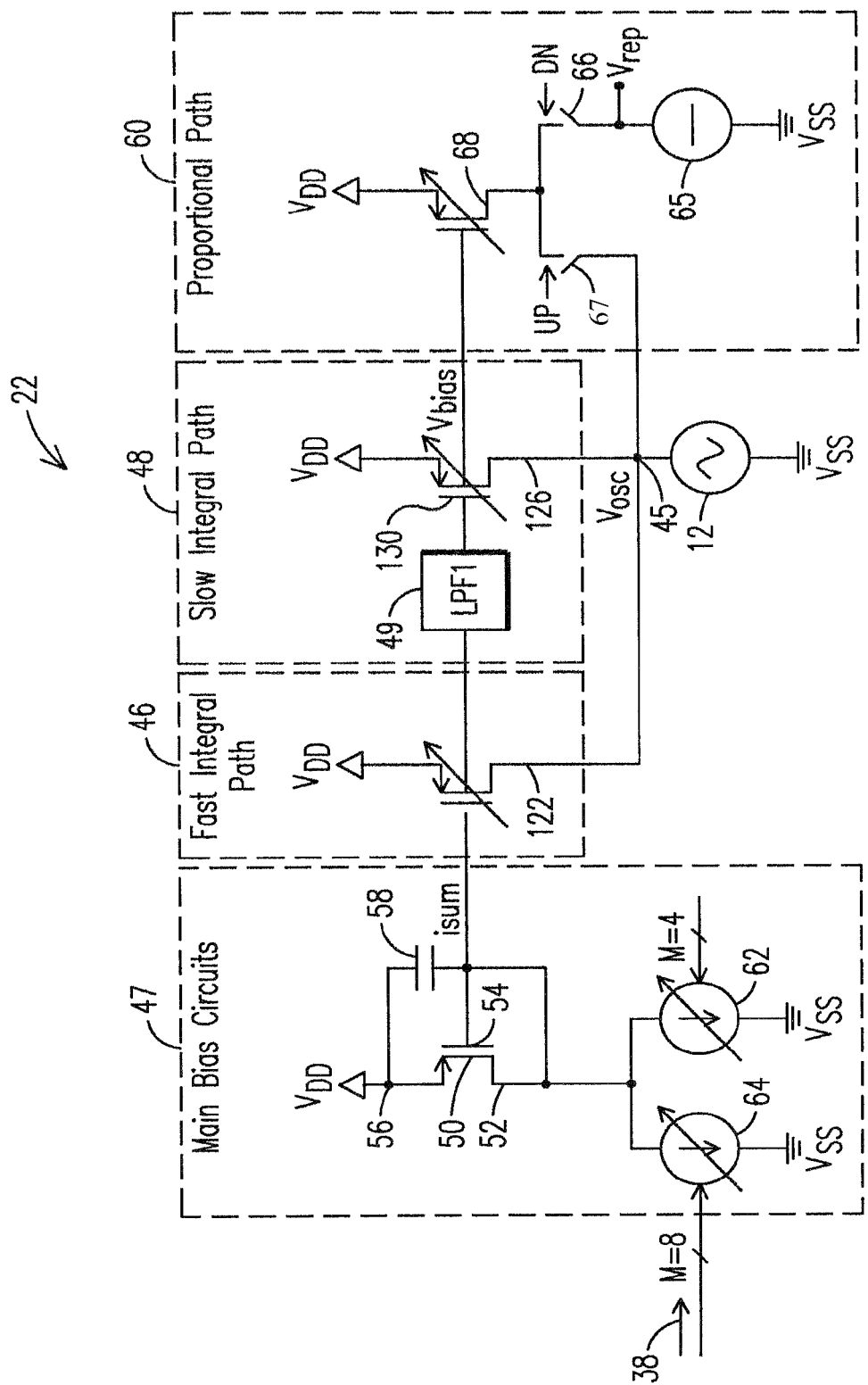
FIG. 6A illustrates exemplary control and interface circuitry for the embodiment shown in FIG. 3, including three paths of control, each providing an adjustment signal.

As illustrated in FIG. 6A, the circuitry 22 receives the output signal 24 in analog form directly from the PFD 20. This analog signal controls switches in proportional path circuitry to provide first adjustment signals (e.g., current signals) to the VCO 12 that contribute to adjustment of the phase of the VCO output signal. In the illustrated embodiment, the circuitry 22 also receives a digitized version of the first analog VCO input signals indirectly from the PFD 20. This digital signal generates a level of current injection in the circuitry 22 that controls other current signals sent to the VCO, i.e., through integral path circuitry in addition to the proportional path circuitry. In the illustrated embodiment the digital signal generates a signal (isum) which controls current sent to the VCO 12 through fast integral path circuitry and through slow integral path circuitry. In response to the control signal (isum) the fast integral path circuitry provides a second adjustment signal through a fast integral path to the first input terminal of the VCO. In response to a filtered version of the control signal (fisum), the slow integral path circuitry provides a third adjustment signal through a fast integral path to the first input terminal of the VCO.

The digital signal also provides a level of control to the current signals sent to the VCO 12 through the proportional path circuitry. Collectively, these individual signals, referenced in FIG. 3 as a combined signal 30, adjust the phase and frequency of the VCO 12 relative to the reference signal 16.

The PFD 20 generates analog signals UP, DN, UN, DP referred to herein as the signals 24, which are indicative of a phase-frequency difference between the VCO feedback signal 18 and the clock reference signal 16. The signal UP indicates that an increase in voltage input to the VCO will reduce a phase-frequency difference between the reference clock signal frequency and the feedback signal 18. The signal DN indicates that a decrease in voltage input to the VCO will reduce a phase-frequency difference between the reference clock signal frequency and the feedback signal 18. The signal UN is the inverse of the signal UP and the signal DP is the inverse of the signal DN. The signals 24 are provided as a first input, fed directly from the PFD 20, to the control and interface circuitry 22.

Figure 4:
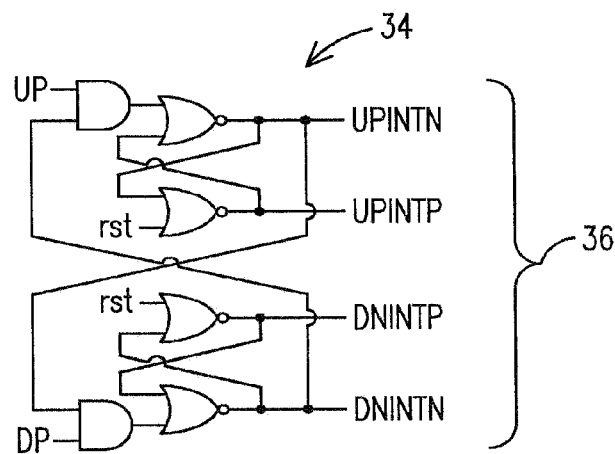
FIG. 4 illustrates exemplary quantizer circuitry for the embodiment shown in FIG. 3.

Given that the PFD provides a signal 24 every reference clock period, its output signals, UP and DP, are discretized. These signals 24 from the PFD 20 are also fed to quantizer circuitry 34, such as illustrated in FIG. 4 comprising logic circuitry which quantizes the signals 24, thereby providing as an output a series of digital adjustment signals 36 comprising UPINTN, UPINTP, DNINTP and DNINTN. UPINTP is the complement of UPINTN and DNINTN is the complement of DNINTP.

Figure 5:
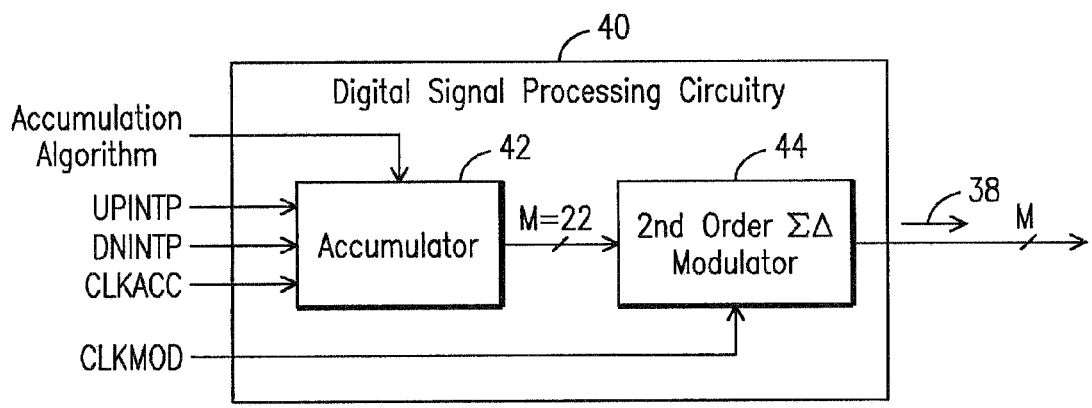
FIG. 5 illustrates exemplary processing circuitry, including an accumulator and a sigma delta modulator, for the embodiment shown in FIG. 3.

The adjustment signals 36 are further processed via digital signal processing circuitry 40 to provide an M bit wide second input signal 38 to the control and interface circuitry 22. With reference also to FIG. 5, the processing circuitry 40 comprises an accumulator 42 and a sigma delta modulator 44. The accumulator 42 is programmable based on algorithm inputs as shown in FIG. 5. In the illustrated embodiment, the quantizer circuitry 34 and the accumulator 42 operate under the control of a clock signal CLKACC which, in this example, is the same as the reference signal 16, but the clock signal input to the accumulator 42 may be at a different frequency than the reference clock signal. The accumulator receives a series of high resolution, e.g., 22-bit wide, adjustment signals 36, UPINTP and DNINTP, at, for example, a rate of 100 MHz. The modulator 24 operates under a clock signal CLKMOD which may, for example, be three times the frequency of the signal CLKACC.

The accumulator 42 accumulates 22 bit values based on a difference between the adjustment signals 36, e.g., (UPINTP−DNINTP), received from the quantizer 34, with a programmable gain, and up to 22-bit resolution. The accumulator 42 performs a function equivalent to the analog charge-pump and capacitor:

$$ACC[n] = ACC[n-1] + GAIN*(UPINTP - DNINTP)$$

for n samples. The variable GAIN controls the speed at which the accumulator accumulates. A high GAIN value allows the accumulator 42 to accumulate faster. However, a high GAIN value also introduces more jitter due to increased integral loop gain which degrades stability. A low GAIN value allows the accumulator to accumulate at a slower rate. A lower GAIN value also decreases the integral loop gain, rendering the PLL more stable. Taking advantage of these conditions, different modes of operation are defined and the optimum GAIN value can be chosen for at least three modes: start up condition, normal operating mode, and special conditions for dynamic modes of operation.

During initial start up of the PLL circuit 10, the frequency of the VCO 12 is adjusted in open loop mode to a frequency very close to the desired frequency. The term open loop mode as used herein refers to a state in which the PLL circuit 10 is not in a closed loop mode. Typically, the difference between the adjusted value in the open loop mode and the desired frequency is 0.5% to 1% of the desired frequency. Once the adjustment is made, the loop is closed so that the PLL goes into its locking mode. The integral loop then reacts to compensate for the 0.5% to 1% frequency offset to ensure the PLL circuit achieves a final VCO frequency equal to the desired frequency. Since the accumulator is a 22-bit word, accumulating one bit at a time per clock cycle is a very slow process as confirmed by the above equation for ACC[n]. In order to accelerate the locking process, an algorithm is provided that modulates the GAIN in a logarithmic fashion for each time period. In one embodiment the GAIN starts at a very high value, for example, $2^{12}$. For each programmable time delay, e.g., one microsecond, that lapses, the GAIN becomes the previous GAIN value divided by 2. This time delay is programmed from a preset 4-bit register, having a range of 1 to 16 microseconds.

$$GAIN = GAIN/2.$$

This reduction in GAIN stops when the GAIN equals 8. Using this method, the PLL circuit 10 achieves frequency locking very quickly while the proportional path ensures that the VCO output signal 14 also stays phase locked.

During normal operating mode, the register GAIN is maintained at a fixed value, e.g., $2^3$. Special Conditions for Dynamic Modes of Operation occur whenever an external condition disturbs the loop, causing a frequency shift in the VCO output signal 14. The PLL must react quickly to recover from such disturbances and return to frequency and phase locked. However, as mentioned above, the integral loop has a relatively slow response time and may require a relatively long period of time in order for the PLL circuit 10 to recover from disturbances.

According to an embodiment of the invention, upon detecting repetitive cycles of consecutive UPINTPs, or upon detecting repetitive cycles of consecutive DNINTPs, the value of the GAIN is changed based on pre-established criteria. The criteria may establish a threshold number of cycles during which there are only consecutive signals UPINTP or only consecutive signals DNINTP upon which occurrence the GAIN is changed in accord with a program. Hence, the GAIN changes dynamically. For example, with a normal mode of operation occurring over a given time period, the GAIN might be $2^3$. If a threshold algorithm determines that a counter, which only counts consecutive occurrences of the same signal, has reached a threshold number (e.g., eight, corresponding to an occurrence of eight consecutive signals UPINTP, or eight consecutive signals DNINTP), then a dynamic change in the GAIN is triggered.

More specifically, if, after an external condition disturbs the PLL circuit 10, a string of consecutive signals UPINTP is received by the accumulator, i.e., with no signal DNINTP between any signal UPINTP, a GAIN change event is triggered in accord with the following conditional statement:

If (consecutive *UPINTP* or consecutive *DNINTP* is met) then GAIN=GAIN*2

As soon as the GAIN value is changed, the threshold algorithm resets the counter to zero and the count re-starts upon occurrence of two consecutive values of the same signal (e.g., UPINTP or DNINTP). However, if there are no consecutive ups or downs for a predetermined programmable time, then the GAIN is reset in accord with

GAIN=GAIN/2 thereby reverting to the GAIN value applied during the normal mode of operation, e.g., $2^3$. Also, each time the counter is incremented above the zero value but stops because two or more consecutive values of the same signal (e.g., UPINTP) are followed by a different signal (e.g., DNINTP), the counter is reset.

The modulator 44 applies a pulse density technique to translate the digital adjustment signals 36 into a series of lower resolution words (e.g., M=8 bits) at a higher clock rate (e.g., with the frequency of CLKMOD set to 600 MHz), as a second input signal 38 to the control and interface circuitry 22. The signal 38 is applied to adjust the VCO input signal 30. Summarily, the second input signal 38 modifies the frequency of the VCO output signal 14 relative to the reference signal 16 while the first input signal, i.e., the portion of the signal 24 fed directly to the control and interface circuitry 22, modifies the phase of the VCO output signal 14.

A feature of embodiments of the invention is that the signals 30 provided by the control and interface circuitry 22 comprise three components, each generated via one of three different paths of control: a proportional circuit path, a fast integral circuit path and a slow integral circuit path. This functionality is schematically illustrated in FIG. 6A. The circuitry 22 includes current source signal driving circuitry, also referred to herein as control circuitry 47, which provides a control signal isum to each of three paths leading to an input node 45 of the VCO 12. The signal isum is delivered to circuitry 46 which forms the fast integral circuit path. The signal isum then passes through a low pass filter 49 to provide a signal $V_{bias}$. The signal $V_{bias}$ controls current passing through circuitry 48 which forms the slow integral circuit path. The signal $V_{bias}$ is also fed to the circuitry 60, 60' of the proportional circuit path. See, also, FIG. 8.

The control circuitry 47 is connected between a supply voltage rail $V_{DD}$ and a reference or ground rail $V_{SS}$. A diode is formed with a FET 50 having its drain 52 tied to the gate 54. A low pass filter capacitor 58 is connected between the gate 54 and the source 56 of transistor 50. Two digital-to-analog converters (DACs) 62, 64 are connected in parallel between the drain 52 and $V_{SS}$.

In the example embodiment the DAC 62 provides a steady state current injection which is programmable based on a four bit input (M=4). The current level from the DAC 62 is set during an initial calibration of the VCO output signal 14. The DAC 64 receives the eight bit (M=8) signal 38 from the Sigma Delta modulator 44 which, for example, may be fed in at a 600 MHz clock frequency to modulate the gate voltage signal isum, which directly or indirectly controls signals fed to the input node 45 from each of the three circuit paths.

Proportional Circuit Path

Figure 8:
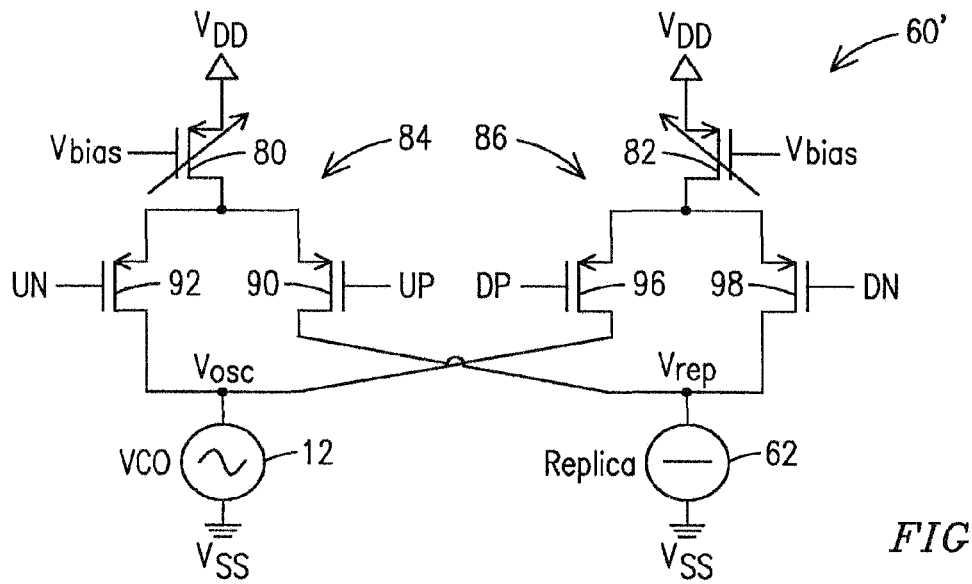
FIG. 8 illustrates an exemplary differential implementation of proportional path circuitry which may be applied in lieu of the single ended implementation of proportional path circuitry shown in FIG. 6.

Functional implementation of the proportional circuit path is illustrated with a single ended implementation as shown with the circuitry 60 in FIG. 6A. FIG. 8 illustrates an exemplary differential implementation of the proportional path circuitry, indicated as circuitry 60'. The circuitry 60, 60' eliminates the need for including a charge pump and an analog loop filter in the proportional path.

The proportional path circuitry 60 receives the pulse signals UP and DP having variable time widths from the PFD 20. The difference in pulse width between UP and DP is proportional to the phase difference between the clock reference signal 16 and the feedback signal 18. The proportional path circuitry 60, connected between $V_{DD}$ and $V_{SS}$, is controlled to provide only a proportional path through the input node 45 to the VCO 12, or only a path through a replica circuit 65 having impedance characteristics which closely follow those of the VCO 12, or no current flow through either the VCO 12 or the replica circuit 65. The replica circuit 65 is positioned between the node $V_{REP}$ and $V_{SS}$. Current flow through one or the other paths, i.e., to the VCO 12 or to the replica circuit 65, is determined by switches 66 or 67 in each branch. Operation of the switch 67 is controlled by the signal UP. When the signal UP goes from a low level to a high level the switch 67 is closed. Otherwise the switch 67 is open. Similarly, operation of the switch 66 is controlled by the signal DN. When the signal DN goes from a low level to a high level the switch 66 is closed. Otherwise the switch 66 is open.

A current minor is set up in the proportional path with a FET 68. With reference to the timing diagrams of FIGS. 7A-7C, the relative delay between the signals UP and DP and the difference in pulse width between the signals UP and DP control the timing of operation of the switches 66 or 67.

The signal UP transitions from a logic low level to a logic high level in accord with transitions of the reference clock signal 16 from a low voltage level to a high voltage level, e.g., at fifty percent of the high voltage level. Similarly, the signal DP transitions from a logic low level to a logic high level in accord with transitions of the feedback clock signal 18 from a low voltage level to a high voltage level, e.g., at fifty percent of the high voltage level.

The switch 67 transitions from an open position to a closed position when the signal UP transitions from a logic low voltage level to a logic high voltage level; and the switch 66 transitions from an open position to a closed position when the signal DP transitions from a logic low voltage level to a logic high voltage level.

Figure 7A:
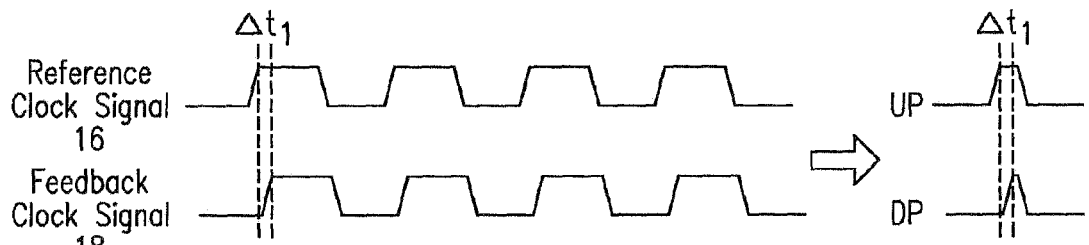
FIGS. 7A-7C illustrate exemplary timing diagrams for an illustrative single ended implementation of proportional path circuitry shown in FIG. 6 to control the timing of operation of the switches.

With reference to FIG. 7A, when the phase of the reference clock signal 16 leads the phase of the feedback clock signal 18 by a time $\Delta t_1$, the signal UP transitions from a logic low voltage level to a logic high voltage level a time $\Delta t_1$ before the signal DP transitions from a logic low voltage level to a logic high voltage level. This causes the switch 67 to transition from an open configuration to a closed configuration a time $\Delta t_1$ before the signal DP transitions from a logic low voltage level to a logic high voltage level. When the feedback clock signal 18 transitions from a low voltage level to a high voltage level, causing the signal DP to transition from a logic low voltage level to a logic high voltage level, both the signal UP and the signal DP then transition from a logic high voltage level to a logic low voltage level thereby placing each of the switches 66, 67 in an open position, terminating current flow through the proportional path circuitry 60.

Figure 7B:
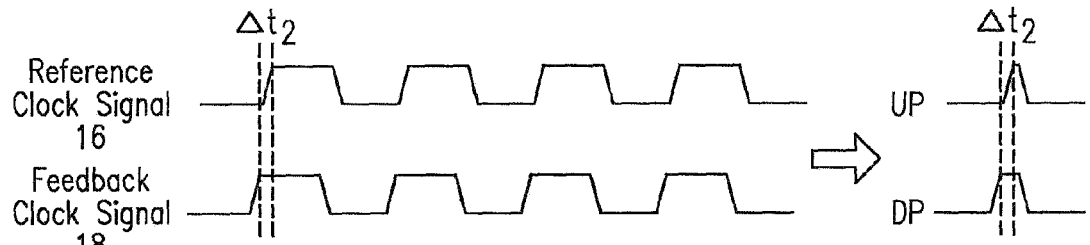

With reference to FIG. 7B, when the phase of the reference clock signal 16 lags the phase of the feedback clock signal 18 by a time $\Delta t_2$, the signal DP transitions from a logic low voltage level to a logic high voltage level a time $\Delta t_2$ before the signal UP transitions from a logic low voltage level to a logic high voltage level. This causes the switch 66 to transition from an open configuration to a closed configuration a time $\Delta t_2$ before the signal UP transitions from a logic low voltage level to a logic high voltage level. When the reference clock signal 16 transitions from a low voltage level to a high voltage level, causing the signal up to transition from a logic low voltage level to a logic high voltage level, both the signal UP and the signal DP then transition from a logic high voltage level to a logic low voltage level thereby placing each of the switches 66, 67 in an open position, terminating current flow through the proportional path circuitry 60.

Figure 7C:
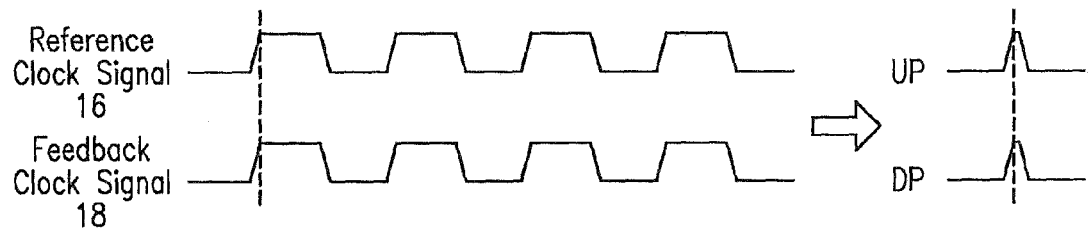

With reference to FIG. 7C, when there is no phase difference between the reference clock signal and the feedback clock signal 18, the signals UP and DP simultaneously transition from a logic low voltage level to a logic high voltage level, whereby both of the switches 66, 67 are held in an open position, preventing any current flow through the proportional path circuitry 60. The signals UP and DP then simultaneously transition from a logic high voltage level to a logic low voltage level with the switches 66, 67 still remaining in open configurations such that no current flows through the proportional path circuitry 60.

Next, referring to FIG. 8, the circuitry 60' includes first and second PMOS FETs 80, 82, each acting as a current mirror in one of two cross coupled branches 84, 86 connected between $V_{DD}$ and $V_{SS}$, in a manner analogous to the circuitry 60. In this example, the source of FET 80 is connected to $V_{DD}$ and the drain of FET 80 is connected to the source of each of two PMOS FETS 90, 92. The drain of FET 90 is connected as an input to the replica circuit 65 and the drain of FET 92 is connected as an input to the VCO 12. The source of FET 82 is connected to $V_{DD}$ and the drain of FET 82 is connected to the source of each of two PMOS FETS 96, 98. The drain of FET 96 is connected as an input to the VCO 12 and the drain of FET 92 is connected as an input to the replica circuit 65.

The gate of FET 90 receives the control signal UP as described with respect to the circuitry 60, and the gate of FET 98 receives the control signal DN, also as described with respect to the circuitry 60. The gate of FET 92 receives a control signal UN, which is the complement of the control signal UP, and the gate of FET 96 receives the control signal DP, which is the complement of the control signal DN.

FIG. 9 are timing diagrams illustrating operation of the control signals in the differential implementation of the proportional circuit path based on the circuitry 60' and the resulting current flow through the proportional circuit path into the VCO 12. Since the control signals UN and DN are complements of UP and DP, respectively, only UP and DP are expressly shown in FIG. 9.

Figure 9A:
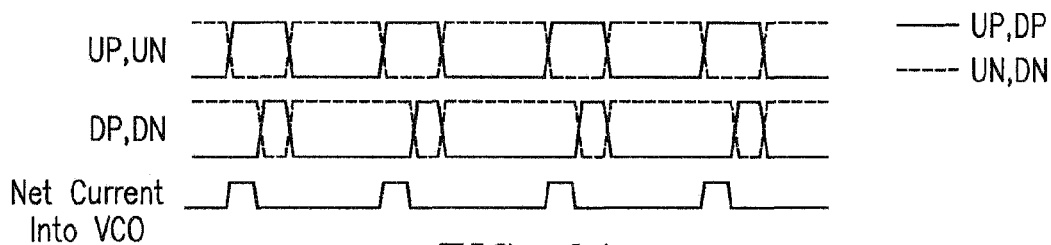
FIGS. 9A-9C are timing diagrams illustrating operation of control signals and current flow in the differential implementation of the proportional path circuitry shown in FIG. 8.

FIG. 9A illustrates logic levels of the control signals and resulting current flow to the VCO 12 when, as described with reference to FIG. 7A, the phase of the reference clock signal 16 leads the phase of the feedback clock signal 18. With the phase of the reference clock signal 16 leading the phase of the feedback clock signal 18 by the time $\Delta t_1$, the phase detector 20 transitions the control signal UP from a logic low voltage level to a logic high voltage level. This places FET 90 in a non-conducting mode, preventing current flow from FET 80 into the replica circuit 65. At the same time that the signal UP transitions to the logic high voltage level, the signal UN transitions from a logic high voltage level to a logic low voltage level. This places FET 92 in a conducting mode, sending current from FET 80 into the VCO 12 during the time interval $\Delta t_1$. Prior to and during the time interval $\Delta t_1$ (i.e., before the feedback clock signal 18, shown in FIG. 7A, transitions from a low voltage level to a high voltage level) the control signal DP is at a logic low voltage level and the complement DN is at a logic high voltage level. Thus, prior to and during the time that FET 92 is in a conducting state, FET 96 is also in a conducting state, sending current from FET 82 into the VCO 12. Also, while FETs 92 and 96 are in conducting states, FET 98 is in a non-conducting mode, preventing current flow from FET 82 into the replica circuit 65. Consequently, during the time interval $\Delta t_1$, both of the branches 84 and 86 feed current to the VCO 12 while the replica circuit 65 receives no current. Thus the current into the VCO increases from a steady state level to a higher level during the period $\Delta t_1$.

Once the time period $\Delta t_1$ lapses, the feedback clock signal 18 transitions from a low voltage level to a high voltage level, such that the phase detector 20 transitions the control signal DP from a logic low voltage level to a logic high voltage level, after which time the phase detector transitions both the signal UP and the signal DP from logic high voltage levels to logic low voltage levels. Simultaneously, complements of each, UN and DN, transition from logic low voltage levels to logic high voltage levels. With the signals UP and DP at logic low voltage levels and the signals UN and DN at logic high voltage levels, the VCO receives the steady state current level through FET 96 only and the replica circuit receives a similar current level through FET 90 only.

Figure 9B:
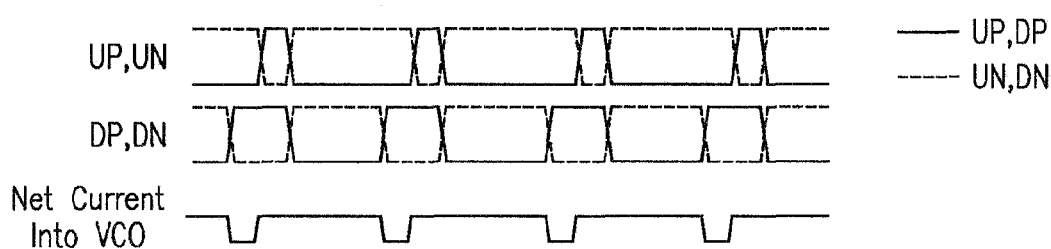

FIG. 9B illustrates logic levels of the control signals and resulting current flow to the VCO 12 when, as described with reference to FIG. 7B, the phase of the reference clock signal 16 lags the phase of the feedback clock signal 18. With the phase of the reference clock signal 16 lagging the phase of the feedback clock signal 18 by the time $\Delta t_2$, the phase detector 20 transitions the control signal DP from a logic low voltage level to a logic high voltage level. This places FET 96 in a non-conducting mode, preventing current flow from FET 82 into the VCO 12. At the same time that the signal DP transitions to the logic high voltage level, the signal DN transitions from a logic high voltage level to a logic low voltage level. This places FET 98 in a conducting mode, sending current from FET 82 into the replica circuit 12 during the time interval $\Delta t_2$. Prior to and during the time interval $\Delta t_2$ (i.e., before the reference clock signal 16, shown in FIG. 7B, transitions from a low voltage level to a high voltage level) the control signal UP is at a logic low voltage level and the complement UN is at a logic high voltage level. Thus, prior to and during the time that FET 98 is in a conducting state, FET 90 is also in a conducting state, sending current from FET 80 into the replica circuit 65. Also, while FETs 90 and 98 are in conducting states, FET 92 is in a non-conducting mode, preventing current flow from FET 80, through FET 92 and into the VCO 12.

Consequently, with the phase of the reference clock signal 16 lagging the phase of the feedback clock signal 18, during the time interval $\Delta t_2$, both of the branches 84 and 86 feed current to the replica circuit 65 while the VCO 12 receives no current from either of the branches 84, 86. Thus the current into the VCO decreases from a steady state level to a lower level during the period $\Delta t_2$. Once the time period $\Delta t_2$ lapses, the reference clock signal 16 transitions from a low voltage level to a high voltage level, such that the phase detector 20 transitions the control signal UP from a logic low voltage level to a logic high voltage level, after which time the phase detector transitions both the signal UP and the signal DP from logic high voltage levels to logic low voltage levels. Simultaneously, complements of each, UN and DN, transition from logic low voltage levels to logic high voltage levels. With the signals UP and DP at logic low voltage levels and the signals UN and DN at logic high voltage levels, the VCO again receives the steady state current level through FET 96 only and the replica circuit receives a similar current level through FET 90 only.

Figure 9C:
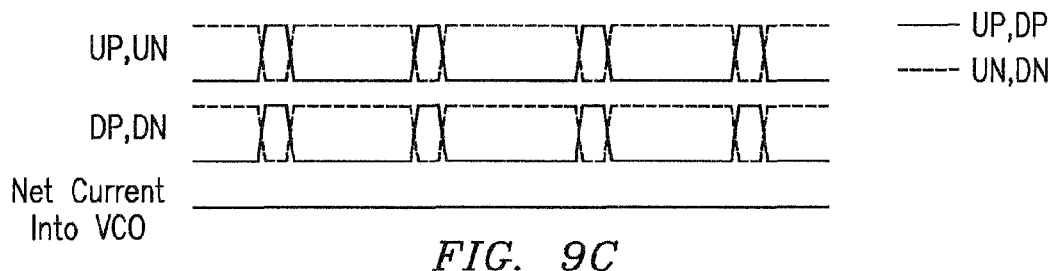

FIG. 9C illustrates logic levels of the control signals and resulting current flow to the VCO 12 when, as described with reference to FIG. 7C, there is no phase difference between the reference clock signal 16 and the feedback clock signal 18. When simultaneously receiving the leading edges of the reference clock signal 16 and the feedback clock signal 18, the phase detector 20 transitions both of the control signals UP and DP from a logic low voltage level to a logic high voltage level. This places FETs 90 and 96 in a non-conducting mode, preventing current flow from FET 80 into the replica circuit 65 and preventing current flow from FET 82 into the VCO 12. Simultaneous with the transitions of both the control signals UP and DP to logic high voltage levels, the control signals UN and DN both transition from a logic high voltage level to a logic low voltage level. This places FETs 92 and 98 into conduction, resulting in passage of current from FET 80 into the VCO 12 and passage of current from FET 82 into the replica circuit 65. Thus there is an exchange in current flows from the steady state arrangement, where FET 92 feeds current to the VCO and FET 98 feeds current to the replica circuit, to an arrangement which lasts a relatively short period where FET 96 feeds current to the VCO and FET 90 feeds current to the replica circuit. The phase detector then transitions the control signals back to the values corresponding to the steady state condition where UP and DP are at logic low voltage levels and UN and DN are at logic high voltage levels such that the VCO again receives the steady state current level through FET 96 only and the replica circuit receives a similar current level through FET 90 only.

With further reference to FIGS. 8 and 9, in the absence of the pulses UP and DP, half of the current flows into the replica circuit 65 and half of the current flows through the VCO 12. Two paths of current flow from the first and second PMOS FETs 80, 82. In the absence of the pulses UP and DP, current flows along a first path from the FET 80 through the FET 90 to the replica circuit 65 and current flows along a second path from the FET 82 to the FET 96 to the VCO 12. With reference to FIG. 9C, once the pulses UP and DP are issued, current flows along one path from the FET 80 through the FET 92 to the VCO 12 and along a second path from the FET 82 through the FET 98 to the replica circuit 65.

With reference to FIG. 9A, when the signal UP leads the signal DP, when UP initially rises to a voltage level high (i.e., while the signal DP is still at a voltage level low) current flows along a first path from the FET 80 through the FET 92 to the VCO 12 and along a second path from the FET 82 through the FET 96 to the VCO 12 such that the VCO receives twice the current relative to the current received prior to the signal UP having reached a logic high. When the signal DP also rises to a voltage level high, the current paths are the same as described with reference to FIG. 9C, i.e., once the pulses UP and DP are issued, current flows along one path from the FET 80 through the FET 92 to the VCO 12 and along a second path from the FET 82 through the FET 98 to the replica circuit 65.

With reference to FIG. 9C, when the signal DP leads the signal UP, when DP initially rises to a voltage level high (i.e., while the signal DP is still at a voltage level low) current flows along a first path from the FET 82 through the FET 98 to the replica circuit 65 and along a second path from the FET 80 through the FET 90 to the replica circuit 65 such that the VCO 12 receives no current from the proportional path while the replica circuit 65 receives twice the current relative to the current received prior to the signal DP having reached a logic high. When the signal UP also rises to a voltage level high, the current paths are the same as described with reference to FIG. 9C, i.e., once the pulses UP and DP are issued, current flows along one path from the FET 80 through the FET 92 to the VCO 12 and along a second path from the FET 82 through the FET 98 to the replica circuit 65.

Operation of the proportional path circuitry 60' according to the illustrated examples of FIG. 9 is characterized by relatively smooth transitions as different FETs simultaneously switch in and out of conduction. In the example illustration of circuitry 60', all of the transistors 90, 92, 96 and 98 have identical characteristics. More generally, in other embodiments, the FETs 92, 96 and the FETs 90, 98 are matched pairs.

In the illustrated proportional path circuitry, stabilization of the voltage input to the replica circuit 65, with respect to the voltage input to the VCO 12, is not based on feedback. Instead, to minimize injection of transient glitches into the VCO during operation of the proportional path circuitry, the replica circuit 65 closely matches the voltage—impedance characteristics of the VCO 12. An embodiment of a replica circuit 65 having impedance characteristics which suitably match the characteristics of the VCO 12 is shown in FIG. 10. Recognizing that the VCO 12 is a non-linear device, the replica circuit 65 is a DC circuit which emulates the input impedance characteristics of the VCO. That is, when the input into the VCO 12 changes, the impedance of the VCO also changes. For a predefined or characteristic operating range of the VCO 12 in the phase locked loop circuit 10, FIG. 11 illustrates how the voltage-current characteristics $V_{REP}$ of the replica circuit 65 track the voltage-current characteristics $V_{OSC}$ of the VCO 12. With the phase locked loop (PLL) circuit 10 not incorporating charge pump circuitry to store charge in a capacitor for input to the voltage controlled oscillator, the impedance characteristics of the replica circuit 65 and the VCO 12 are so matched that current-voltage characteristics of these two impedance devices can be within five percent of one another throughout the voltage operating range of the VCO. With substantially matched impedance characteristics of the VCO 12 and the replica circuit 65, the system does not incorporate charge pump circuitry to store charge in a capacitor for input to the voltage controlled oscillator.

The impedance characteristics of the replica circuit 65 can so closely follow the impedance characteristics of the voltage controlled oscillator as a function of voltage level as to allow a voltage level to be switched between the subcircuit 65 and the voltage controlled oscillator 12 without creating voltage spikes, when a voltage level is switched between the replica circuit 65 and the VCO. More generally, when a voltage level is switched between the replica circuit and the VCO 12, voltage spikes can be controlled to a range between zero and two percent of the operating voltage applied to the VCO.

Figure 1A:
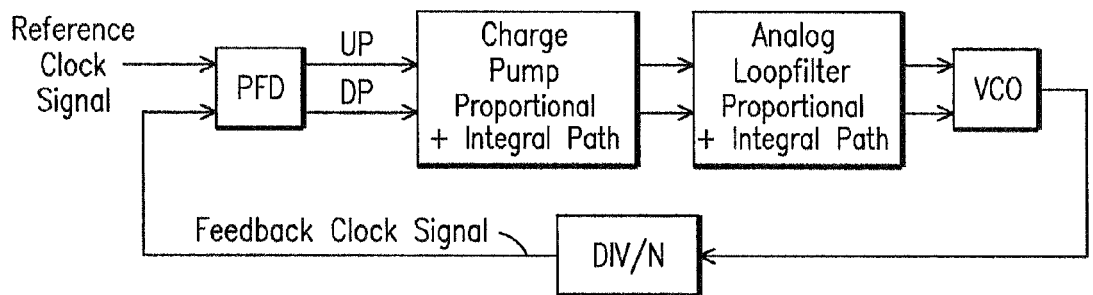
FIG. 1A illustrates an analog phase locked loop circuit incorporating a charge pump, an analog loop filter and a trans-conductance ($G_m$) amplifier.
Figure 1B:
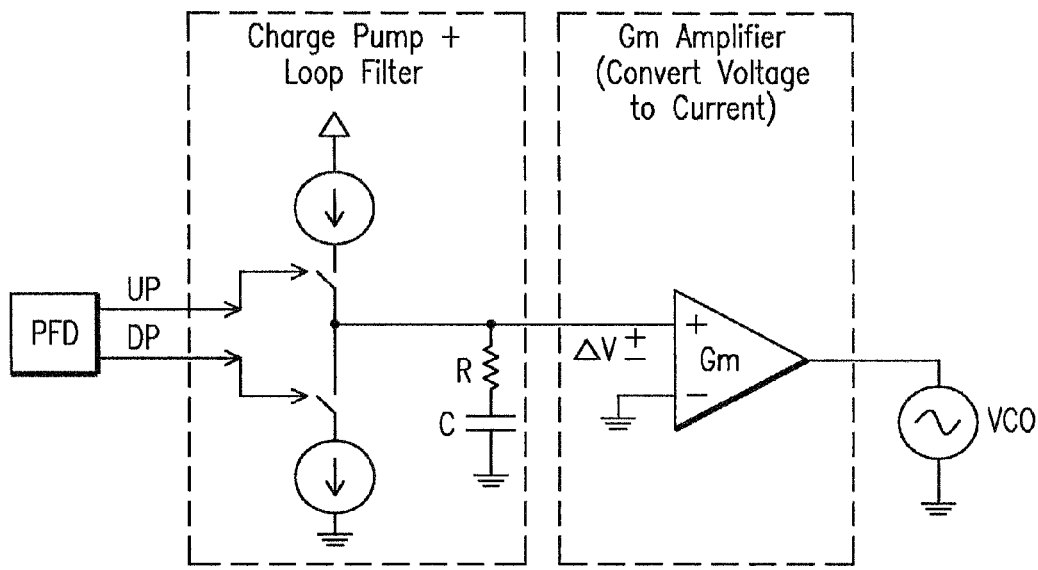
FIG. 1B further illustrates components of the circuit shown in FIG. 1A.
Figure 1C:
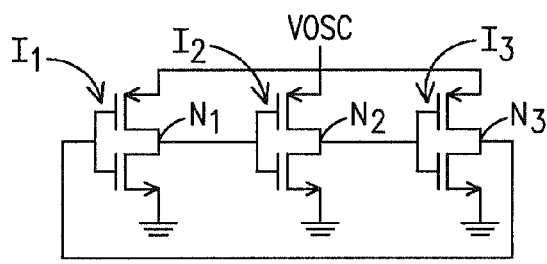
FIG. 1C illustrates a conventional ring oscillator circuit.
Figure 2:
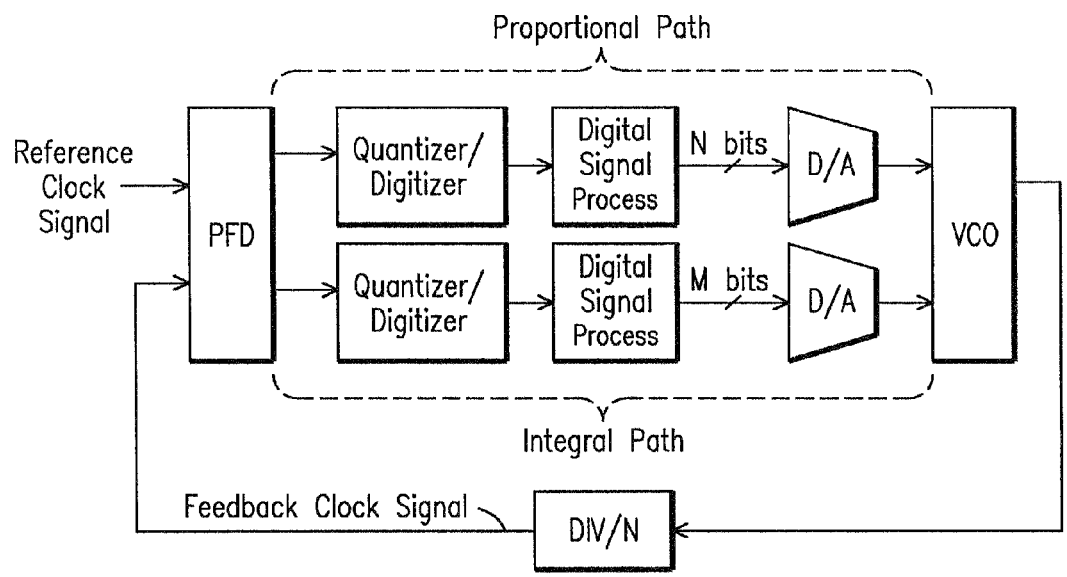
FIG. 2 FIG. 2 illustrates a digital phase locked loop circuit.

The replica circuit 65 is a static DC circuit which tracks the impedance characteristics of a dynamic circuit such as the three stage inverter ring oscillator of FIG. 1C. For a given bias and consequent frequency response, f, the group delay, i.e., the collective phase shift, of the three stages is 360°. Hence, this means each inverter stage has a delay of 120° and each of the nodes I1, I2, and I3, due to the phase shift, will be at a different potential (gate to ground) at any given time. With regard to the circuit 65 of FIG. 10, the device 102 is a PMOS FET having the gate connected to ground. This corresponds to one or more of the PMOS transistors in FIG. 1C when the potential of one of the gate nodes $N_1$, $N_2$, $N_3$ is close to zero. The device 108 is an NMOS FET having the gate connected to $V_{REP}$. This represents one or more of the NMOS transistors in FIG. 1C when the potential of one of the nodes $I_1/I_2/I_3$ is close to $V_{OSC}$. The gate of the PMOS FET 104 is connected to a node between the FETs 106 and 108, resulting in a gate potential which is neither low nor high such that the NMOS FET 104, connected to a node between 102 and 104 that is neither at $V_{REP}$ or ground. This corresponds to the voltage level at one of the nodes N1, N2, N3 when the node is in between a high state ($V_{REP}$) and a low state (ground). To summarize, the devices 102 and 108 operate in triode mode, which corresponds to the impedances of some of the transistors in the VCO ring that are fully switched due to their gate biasing voltage being at $V_{REP}$ or ground; while the devices 104 and 106 operate in the saturation mode which corresponds to the impedances of some of the transistors in the VCO ring oscillator that are partially switched on due to their gates being biased at a voltage between $V_{REP}$ and ground.

To summarize, the proportional path circuitry 60, 60' receives inputs from the PFD 20 which generates pulses where the pulse width difference is proportional to the phase difference of the feedback clock and the reference clock. The proportional path has three modes of operation based on the signals UP, UN, DP, and DN. In FIG. 9A, the phase of the reference clock is shown to lead the feedback clock and there is a positive current injection into the VCO. In FIG. 9B, the phase of the reference clock is shown to lag the feedback clock. Hence there is negative current injection into the VCO. FIG. 9C illustrates the condition where there is no phase mismatch between the reference clock and the feedback clock. Hence, there is no change in the total net current injected into the VCO.

Figure 6B:
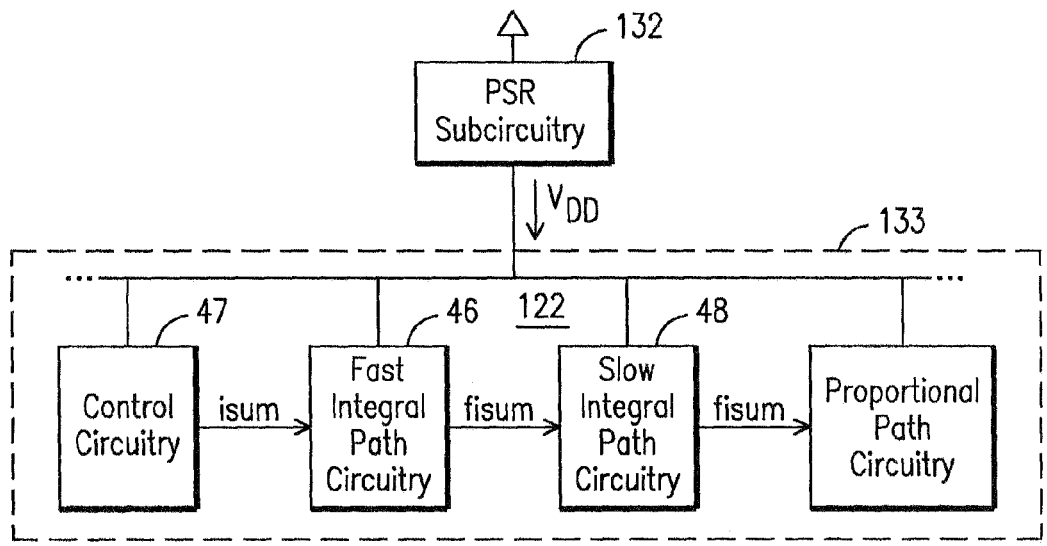
FIG. 6B illustrates placement of power supply rejection circuitry in relation to the control and interface circuitry of FIG. 6A.

In the past the charge pump, loop filter, and trans-conductance amplifier have been necessary to translate the full swing up and down signals from the PFD into the VCO as described with respect to FIG. 1B. Use of a loop filter having a large passive device is a growing impediment in monolithic manufacturing processes that move past the 45 nanometer node. Further, the loop filter provides a path for noise transfer to the VCO. By eliminating the charge pump, loop filter, and the small signal $G_m$ amplifier, associated with the analog PLL of FIG. 1, the proportional path is simplified in accord with FIGS. 3, 6 and 8, resulting in several advantages. The small signal $G_m$ amplifier is a wide band device because it typically needs to process signals with a bandwidth up to several hundred megahertz. Hence, in prior PLL circuits most of the noise from the current sources in the charge pump, as well as thermal noise from the resistor R of FIG. 1C have passed directly through the $G_m$ amplifier into the VCO. Also, noise inherent in the $G_m$ amplifier has been injected into the VCO. Consequently, the high gain path has led to greater noise amplification. Elimination of this block removes unnecessary noise which would otherwise be generated from the charge pump, the loop filter, and the $G_m$ amplifier. Instead, in the PLL circuit 10 the signals are sent directly from the PFD 20 to the control and interface circuitry 22. The output of the PFD 20 simply controls switches, as described in FIGS. 6-9. This design eliminates a path for noise to travel to the VCO 12. Another feature of the PLL circuit 10 is that the current source is heavily filtered, resulting in a reduced noise level. However, lack of gain using this method limits the system bandwidth. To introduce more gain, the DC current of the proportional path is made relatively high. In prior PLL circuits this would normally create a complication in device matching and repeated generation of current spikes. Thus this architecture has not been used previously due to these performance limitations. Now, by providing the separate VCO replica circuit 65 as shown in FIG. 6, these issues are resolved. $V_{REF}$ closely follows $V_{OSC}$, allowing large currents to be switched between the replica circuit 65 and the VCO 12 without creating large current spikes.

With reference again to FIG. 6A, the circuitry 46 which forms the fast integral path comprises a FET 122 connected between $V_{DD}$ and the input node 45. The source terminal of the FET 122 is connected to $V_{DD}$ and the drain terminal of the FET 122 is connected to the node 45. The fast integral path circuitry 46 is programmable and in the present embodiment conducts up to twenty percent of the total input current to the VCO 12, e.g., ten percent. The cut-off frequency of signals propagating through the fast integral path circuitry 46 is limited by the transconductance of the FET 50 and the capacitor 58. The capacitance is selectable to limit the amount of noise passing into the FET 122. The bandwidth of the Device 122 is about ten MHz.

Still referring to FIG. 6A, the circuitry 48 which forms the slow integral path comprises a FET 126 connected between $V_{DD}$ and the input node 45. The source terminal of the FET 126 is connected to $V_{DD}$ and the drain terminal of the FET 126 is connected to the node 45. The circuitry 48 includes the low pass filter 49 through which the signal isum passes to remove high frequency noise before input to the gate 130 of the FET 126. The bandwidth of the low pass filter 49 is programmable, i.e., adjustable, and may, for example, range from five KHz to one MHz, thus limiting the bandwidth of devices 126 and 68 to the same range. However, signal propagation through the proportional path circuitry is controlled by switches 66, 67 (see FIG. 6A), where device 68 provides the bias current. The proportional path bandwidth is limited by the impedance at the input node 45, which varies between 100 MHz and 400 MHz.

The fast integral path (circuitry 46) and the slow integral circuit path (circuitry 48) control the frequency of the VCO 12. Changes in application environmental parameters, e.g., temperature and supply voltage, can affect the frequency of the VCO output signal 14. A change in the absolute temperature changes transistor switching speeds which result in a change in VCO frequency. The integral path compensates for the VCO frequency variations due to these parameters and stabilizes the VCO frequency at the desired value. Parameters such as off chip supply voltage and temperature change at a very slow rate, typically at kilo-hertz rate or slower. Hence, the slow integral path is designed to operate at a bandwidth as low as five KHz. However, other parameters such as reference clock frequency modulation can be set as high as 133 KHz. The fast integral loop is designed to operate at a ten MHz bandwidth to ensure it can remove frequency errors due to reference clock frequency modulation. In both cases, the bandwidth should be higher than the possible change rate in order to quickly correct for deviations resulting from these and other environmental parameters.

Figure 13:
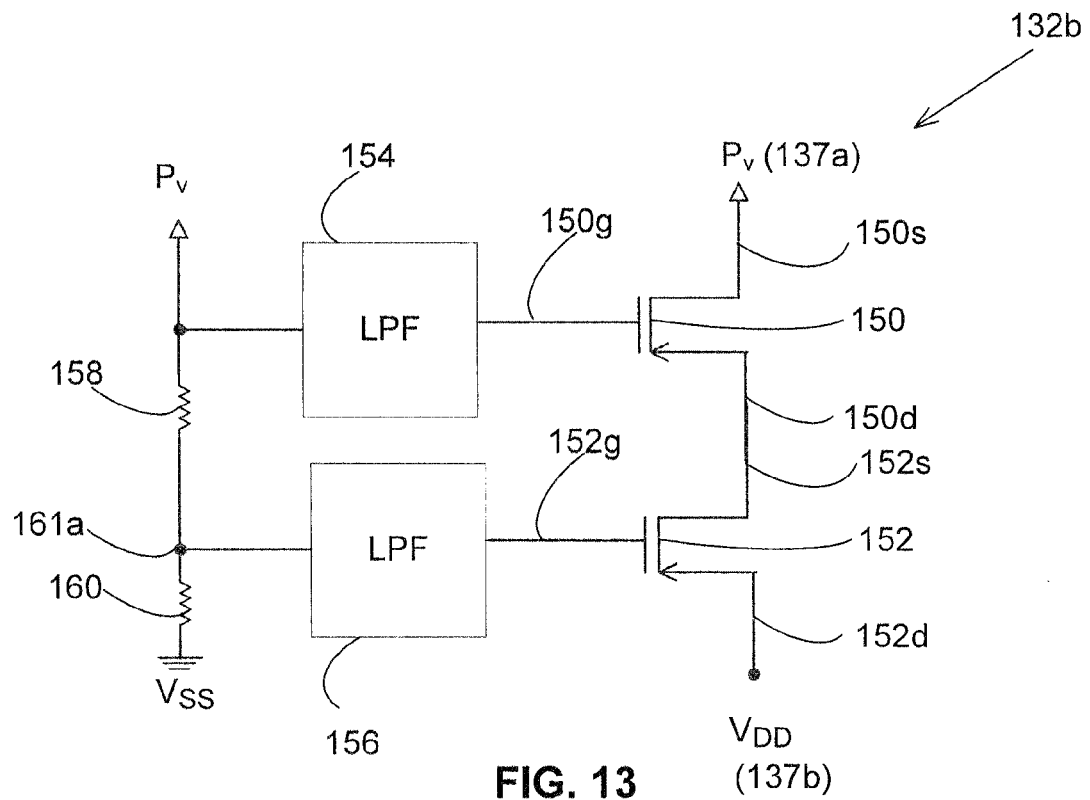
Figure 14:
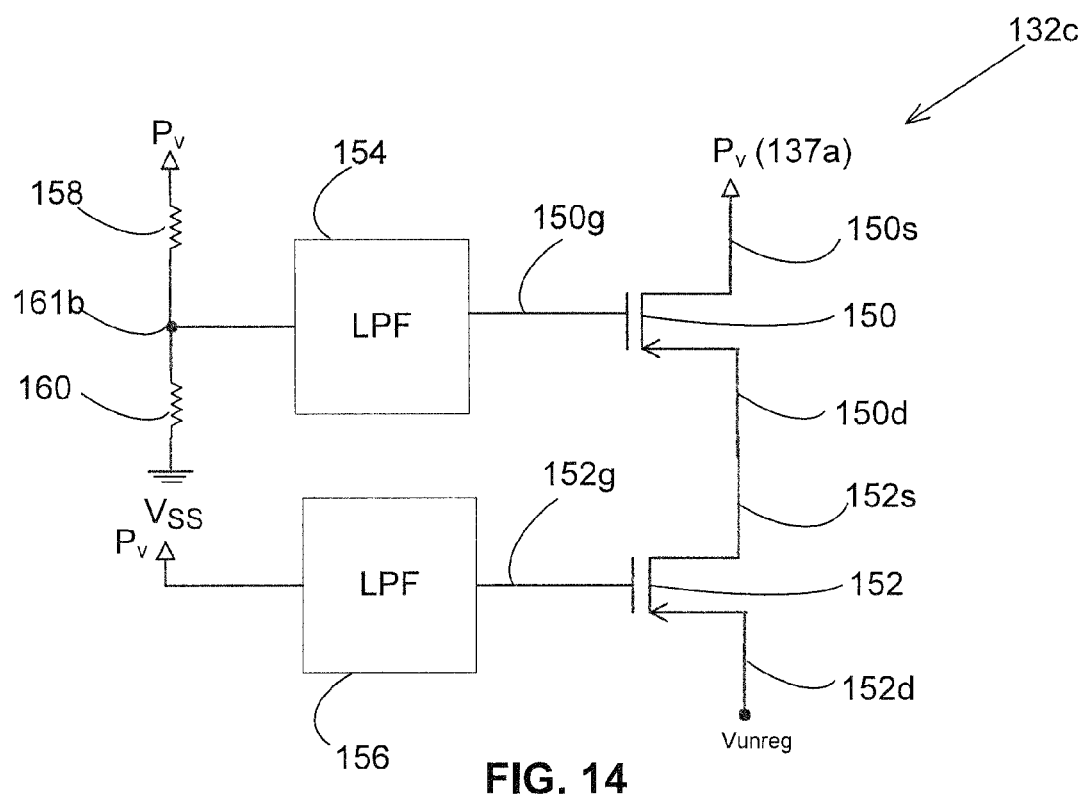

To minimize jitter in the VCO 12 it is important to reduce or eliminate noise from the power supply rails. In the past, linear regulators have been used to provide power supply rejection. However, this type of implementation requires feedback circuits and a reference voltage. A feature of embodiments of the invention is that neither a feedback circuit nor a reference voltage is required to provide power supply rejection. As shown generally in FIG. 6B, the phase locked loop circuit 10 comprises Power Supply Rejection (PSR) subcircuitry 132 connected to provide the supply voltage $V_{DD}$ to other subcircuitry 133 of the phase locked loop circuit 10, including the control and interface circuitry 22 (e.g., fast integral path circuitry 46, control circuitry 47, slow integral circuit path circuitry 48 and proportional path circuitry 60, 60'). Example designs of the PSR subcircuitry 132 shown in FIGS. 12-14, are referenced as subcircuitry 132a, 132b and 132c.

With respect to transistor devices as now described in the context of the PSR subcircuitry, and other devices illustrated with reference to the phase locked loop circuit 10, the disclosed embodiments incorporate field effect transistors (FETs) but the invention is not so limited. In the context of embodiments which utilize FETs, the term region refers to a distinct and identifiable portion of a transistor, such as a source, a drain or a gate, and the term region may be used interchangeably with any one of these and interchangeably with a terminal to which one of these is in electrical conduction. The term source/drain region as used herein means a semiconductor region or a terminal leading to the semiconductor region wherein the region operates as a source or as a drain of a transistor device. Filter or filter element means one or more capacitor devices, which are illustrated herein as two terminal devices.

A filter element may include one or more resistors, and reference to a filter element includes reference to impedance networks generally. The term filter refers to a filter which may be an analog filter or a digital filter. Low pass filter means a filter which is has a frequency characteristic wherein above a given frequency there is notable signal attenuation. Terminal and connection may refer to a point of contact which effects connection although in highly integrated circuitry a physical connection may not be a characterized by a distinct connection point which can be isolated from other conductive material. Also, reference to a point of connection or a terminal which receives a source of external power or voltage is to be understood as a point in circuitry which may receive such power or voltage during circuit operation but which may not be present when the circuitry is not operating.

The circuitry of FIG. 12 is exemplary of filter circuitry providing power supply rejection for the exemplary phase locked loop subcircuitry 133. PSR subcircuitry 132a is connected to an exemplary terminal or connection point 139 to receive a first supply voltage $P_v$ from a source external to the phase locked loop circuit 10 and provide a second supply voltage, $V_{DD}$, to the phase locked loop subcircuitry 133 through an exemplary connection 137b. The PSR subcircuitry 132a is configured with the drain 136d of a NMOS transistor 136 connected to an exemplary terminal 137a at which the supply voltage $P_v$ may be provided from the external source. The source 136s of the NMOS transistor 136 is connected to provide current to the phase locked loop subcircuitry 133 through an exemplary connection 137b. A low pass filter 138 is connected between the gate 136g of the transistor 136 and the exemplary terminal or connection point 139 to drive the high impedance gate 136g of the transistor with a filtered version of the signal derived from the first supply voltage $P_v$ when received from the external supply voltage source. Application of the filtered version of the signal to the gate 136g provides a voltage $V_{DD}$ at the source terminal 137b which exhibits power supply rejection above a cut-off frequency set by the filter, i.e., determined in part by the filter characteristics. Below the cut-off frequency $V_{DD}$ tracks $P_v$. Above the cut-off frequency $V_{DD}$ does not track variations in the supply voltage $P_v$. In other embodiments, additional NMOS transistors and or filters may be stacked to increase the amount of power supply rejection. See, for example, the circuits of FIGS. 12 and 13.

The circuitry of FIG. 13 includes PSR subcircuitry 132b connected to receive a first supply voltage $P_v$ and provide a second supply voltage $V_{DD}$ to the phase locked loop subcircuitry 133 through the exemplary connection 137b. The PSR subcircuitry 132b comprises a resistor-capacitor network and multiple PMOS transistors. In this example, two transistors 150, 152, two low pass filters 154, 156 and two resistors 158, 160 are illustrated, it being understood that other embodiments may comprise additional transistors, low pass filters and resistors. The transistors 150, 152 are arranged in series with the source 150s of the transistor 150 connected to an exemplary power supply terminal 137a at which a supply voltage $P_v$ may be provided from a source external to the PLL circuit 10. The drain 150d of the PMOS transistor 150 is connected to the source 152s of the PMOS transistor 152. The drain 152d of the PMOS transistor 152 is connected to provide current to the phase locked loop subcircuitry 133 through the exemplary connection 137b.

The high impedance gates 150g 152g of the two PMOS transistors 150, 152 are each connected to an exemplary terminal or connection point 139, at which the supply voltage $P_v$ may be received from a source external to the PLL circuit 10. Resistors 158 and 160 are positioned between $P_v$ and a reference terminal $V_{SS}$. Each of the two low pass filters 154, 156 is connected on a different side of the resistor 158 while the resistor 160 further limits current flow to $V_{SS}$. The gate 150g of the transistor 150 is connected through the low pass filter 154 is driven with a signal derived from the first supply voltage $P_v$ when received from the external supply voltage source.

The gate 152g of the transistor 152 is connected in series through the low pass filter 156 and the resistor 160 to also receive and be driven with a signal derived from the first supply voltage $P_v$, when received from the external supply voltage source. The filter 156 is connected between the gate 152g and a connection point 161a between the resistor 158 and the resistor 160. With this arrangement the drain 150d of the first transistor 150 provides a first modified limits current flow to $V_{SS}$.

The filters 154, 156 provide the supply voltage $V_{DD}$ at the terminal 137b which exhibits power supply rejection above a cut-off frequency set by the filters 154, 156, i.e., determined in part by the filter characteristics. Below the cut-off frequency $V_{DD}$ tracks $P_v$. Above the cut-off frequency $V_{DD}$ does not track variations in the supply voltage $P_v$. In other embodiments, additional transistors and filters may be incorporated in the subcircuitry 132b to increase the amount of power supply rejection.

The circuitry of FIG. 14 includes PSR subcircuitry 132c connected to receive a first supply voltage $P_v$ and provide a second supply voltage $V_{DD}$ to the phase locked loop subcircuitry 133 through the exemplary connection 137b. The PSR subcircuitry 132c comprises a resistor-capacitor network and multiple PMOS transistors. In this example, two PMOS transistors 150, 152, two low pass filters 154, 156 and two resistors 158, 160 are illustrated, it being understood that other embodiments may comprise additional transistors, low pass filters and resistors. The transistors 150, 152 are arranged in series with the source 150s of the transistor 150 connected to an exemplary power supply terminal 137a at which a supply voltage $P_v$ may be provided from a source external to the PLL circuit 10. The drain 150d of the PMOS transistor 150 is connected to the source 152s of the PMOS transistor 152. The drain 152d of the PMOS transistor 152 is connected to provide current to the phase locked loop subcircuitry 133 through the exemplary connection 137b. The high impedance gates 150g 152g of the two PMOS transistors 150, 152 are each connected to one or more exemplary terminal or connection points 139, at which the supply voltage $P_v$ may be received from a source external to the PLL circuit 10. Resistors 158 and 160 are positioned between $P_v$ and a reference terminal $V_{SS}$.

The low pass filter 154 is connected at a node 161 between the resistors 158, 160 so that the gate 150g of the transistor 150 is connected in series, through the filter 154 and the resistor 158, to be driven with a signal derived from the first supply voltage $P_v$, when received from the external supply voltage source at a terminal or connection point 139. The resistor 160 further limits current flow to $V_{SS}$. The low pass filter 156 is connected between the gate 152g of the transistor 152 and a terminal or connection point 139 to receive a signal derived from the first supply voltage $P_v$ when received from the external supply voltage source, and drive the gate 152g of the transistor 152 with the derived signal.

The low pass filter 154 is connected at a node 161b between the resistors 158, 160 so that the gate 150g of the transistor 150 is connected in series, through the filter 154 and the resistor 158, to be driven with a signal derived from the first supply voltage $P_v$, when received from the external supply voltage source at a terminal or connection point 139. The resistor 160 further limits current flow to $V_{SS}$. The low pass filter 156 is connected between the gate 152g of the transistor 152 and a terminal or connection point 139 to receive a signal derived from the first supply voltage $P_v$ when received from the external supply voltage source, and drive the gate 152g of the transistor 152 with the derived signal.

In the designs of FIGS. 12, 13 and 14, the transistors are kept in saturation to provide maximum power supply rejection, but they can operate in other regions. With the filter techniques of FIGS. 12-14, the regulated supply voltage $V_{DD}$ moves with respect to $P_v$ up to the bandwidth of the low pass filter whereas, in previous designs, the supply going to the VCO has been regulated via feedback to ensure the supply stays constant.

In summary, the phase locked loop circuit 10 runs with lower jitter than a typical analog PLL, but contains a reduced number of analog blocks compared to an analog PLL. In an advantageous embodiment, the VCO 12 is an analog component while all other components are digital, this rendering the design more suitable for low voltage operation and more portable to current and future small geometry manufacturing technologies. PLL circuits according to the invention are also much less process and environmentally sensitive than PLL analog designs. The loop-dynamics of the PLL circuit 10 can be described by the cut-off frequency:

$$F_{cut-off} = K_{VCO}/(2\pi N) \quad (1)$$

where $K_{VCO}$ is the analog tuning gain of the VCO and N is the PLL feedback divider value (DIV/N). As can be seen from Equation (1), $K_{VCO}$ is the only process sensitive parameter in the loop dynamics of the PLL circuit 10. This results in relatively stable operation, making the PLL circuit 10 very robust and suitable for large volume production.

Numerous inventive features have been described. These include (1) phase locked loop circuitry having a triple path for phase and frequency control, there being a proportional path, a fast integral path and a slow integral path; (2) programmable control of the slow integral path by adjusting its bandwidth for use in loop dynamics; and (3) an open regulation technique which does not use feedback to achieve power supply rejection. The proportional path eliminates the need for a charge pump, loop filter, or equivalent digital PLL techniques by its direct usage in switching current up to 40% of the total VCO bias current. An embodiment uses a filtered clean bias voltage from the slow integral path to bias the proportional path current. Also, a new static no feedback replica circuit is disclosed which tracks a dynamic circuit's average switching current. These and other concepts are disclosed herein for numerous applications and the embodiments and specific applications shown herein are not to be construed as limiting.

Figure 15:
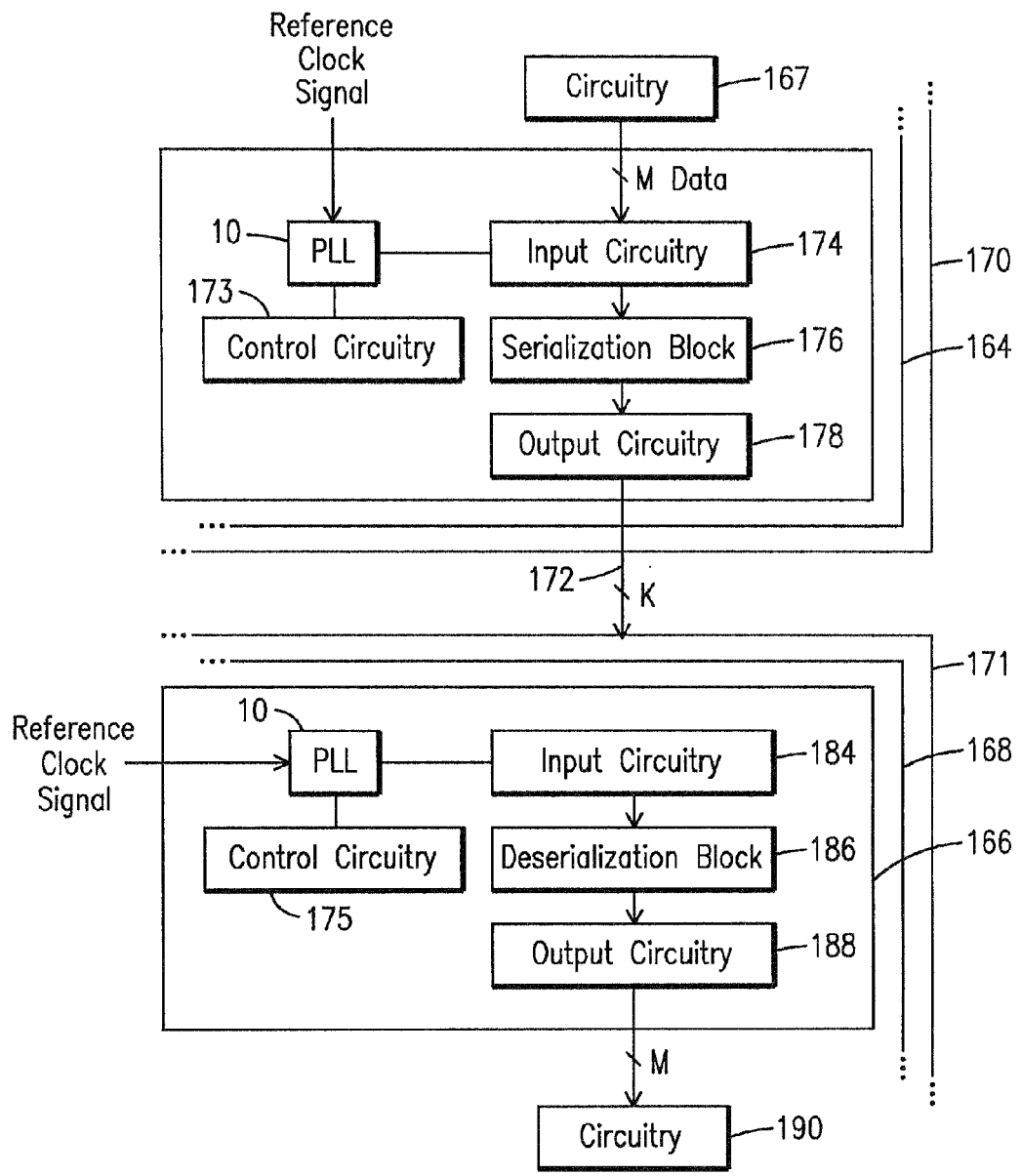
FIG. 15 is a simplified schematic illustration of serializer/deserializer components incorporating phase locked loop circuits according to the invention.

The inventive concepts may be advantageously applied in a variety of electronic systems. As one example, there is a need for increased rates of data transfers between devices, e.g., integrated circuits and, for a variety of reasons, these transfers are performed with high speed serializer/deserializer devices commonly referred to as Serdes. In lieu of having n-bit wide parallel data transfers between devices, data is serialized to reduce the level of parallelism. This reduces the pin count of each device, but the data transfer frequency increases in inverse proportion to the ratio by which the pin count is reduced. Typically, to control the movement of data transfers, each device establishes a data transfer rate by multiplying a reference clock speed with intermediate frequency PLL circuitry. The increased clock speed may be further stepped up with one or more other PLL circuits in each of one or more Serdes cores formed on the device to control specific data clocking functions. FIG. 15 is a simplified schematic illustrating a serializer 162 from which data is transferred in a first device 164 (e.g., a first integrated circuit) to a deserializer 166 in a second device 168 (e.g., a second integrated circuit). The first device 164 is a component of a first system 170 and may be mounted on a first pc board. The second device 168 is a component of a second system 171 and may be mounted on a second pc board. The serializer 162 receives m-bit wide parallel data from circuitry 167 within the first device 164 and converts the data to a lower bit width, k, of parallel data for transfer along the serialized data line 172 to the deserializer 166 which then performs a post transfer restoration of the data to the original m-bit width for operation thereon by other circuitry in the second device 168. The serializer 162 and the deserializer 166 each include one or more phase locked loop circuits 10 which receive a reference clock signal to facilitate operation of first control circuitry 173 of the serializer 162 or operation of second control circuitry 175 of the deserializer 166. The m-bit wide data is initially received by first input circuitry 174 of the serializer, then undergoes parallel-to-serial conversion in serialization block 176, from which the data passes through first output circuitry 178 and are then transmitted off chip via the data line 172. The serialized data stream is received by the second input circuitry 184 of the deserializer 166 and then undergoes serial-to-parallel conversion in deserialization block 186 to recreate m-bit wide parallel data which pass through second output circuitry 188 to other circuitry 190 in the second device 168 for processing. The phase locked loop circuits 10 illustrated in FIG. 15 are coupled to control circuitry 173 or 175 to provide timing and control which assures stability of the timing signals according to which data is serialized, transferred and deserialized. Thus the inventive concepts may be implemented on two separate systems 170 and 171, each having a device comprising circuitry (i) for performing serialization of data from a m-bit wide parallel arrangement to a k-bit wide parallel arrangement for transfer of the data to another device, or (ii) for performing deserialization of data from a k-bit wide parallel arrangement to a m-bit wide parallel arrangement for transfer of the data to another device, where k<m.

While the invention has been described with reference to particular embodiments, it will be understood by those skilled in the art that numerous inventive concepts disclosed herein can be implemented in a variety of circuit applications and systems. Many of the aforedescribed improvements can, for example, be implemented in delay locked loop (DLL) circuitry to adjust the phase of a signal or for clock recovery. Although not illustrated, with reference generally to the foregoing figures and, specifically, the phase locked loop circuitry 10, it will be understood by those skilled in the art that such DLL circuitry according to the invention will comprise phase detector circuitry in lieu of the illustrated phase and frequency detector 20, and a chain of delay gates in lieu of the VCO 12. DLL circuitry incorporating features of the invention may be integrated into, for example, memory devices such as Dynamic Random Access Memory (DRAM) devices.

Further, various modification to the described embodiments are contemplated and equivalents may be substituted for elements thereof without departing from the spirit of the invention. Accordingly, the scope of the invention is only limited by the claims which follow.

The claimed invention is:

1. An electronic system including:
   a first subcircuitry;
   a second subcircuitry, and
   a phase locked loop (PLL),
   wherein the first subcircuitry positioned to provide a supply voltage, $V_{DD}$, as a filtered version of power, $P_V$, available from an external power source, to the second subcircuitry, wherein the first subcircuitry is separate from the second subcircuitry,
   wherein the first subcircuitry comprises:
      a first transistor having first and second source/drain regions and a gate region; and
      a first low pass filter coupled to receive a power source signal from the external power source during operation of the second subcircuitry,
         wherein the first low pass filter is also coupled to provide a filtered version of the power source signal to the gate region of the first transistor, so that when the first source/drain region of the first transistor is coupled to receive power from the external power source and the gate region of the first transistor receives the filtered version of the power source signal, the second source/drain region of the first transistor provides a first modified version of the power, $P_V$, received from the external power source,
   wherein the second subcircuitry includes:
      a second transistor directly coupled in series with the first transistor,
         wherein the first and second transistors are of a same conductivity type, wherein the second transistor has first and second source/drain regions and a gate region, wherein the first source/drain region of the second transistor is coupled to the first transistor, and wherein the second source/drain region of the second transistor is coupled to a power node of the PLL; wherein the first source/drain region of the second transistor is coupled to receive the first modified version of the power, $P_v$, received from the external power source;
   wherein the electronic system further comprises:
      a first resistor; and
      a second low pass filter coupled in series with the first resistor to receive a signal from the external power source during operation of the second subcircuitry, wherein the second low pass filter is coupled to provide a second filtered version of the power source signal to the gate region of the second transistor, so that when the first source/drain region of the first transistor receives power, $P_v$, from the external power source and the second low pass filter provides the second filtered version of the power source signal to the gate region of the second transistor, the second source/drain region of the second transistor provides a second modified version of the power, $P_V$, in accord with application of the second filtered version of the power source signal to the gate region of the second transistor.

2. The electronic system of claim 1 wherein, when the first transistor is coupled to receive power from the external power source and the gate region of the first transistor receives the filtered version of the power source signal, the first modified version of the power, $P_v$, received from the external power source is provided to the second subcircuitry as the supply voltage $V_{DD}$.

3. The electronic system of claim 1, wherein the second subcircuitry is coupled to receive the second modified version of the power, $P_V$.

4. The electronic system of claim 1, wherein the second filtered version of the power source signal provides the gate region of the second transistor with a gate voltage which provides power supply rejection above a cut-off frequency determined in part by filter characteristics.

5. The electronic system of claim 1 further including:
   a second resistor coupled in series with the first resistor, the first and second resistors positioned between a reference terminal $V_{SS}$ and a connection for receiving the power, $P_V$, when the power is made available from the external power source, the second resistor limiting current flow to the reference terminal $V_{SS}$ when the first source/drain region of the first transistor is coupled to receive the power $P_V$.

6. The electronic system of claim 1, wherein the power node provides power supply to the PLL, and wherein the PLL comprises:
   control and interface circuitry,
   fast integral path circuitry,
   control circuitry,
   slow integral circuit path circuitry, and
   proportional path circuitry.

7. The electronic system of claim 1 further comprises a serialization or deserialization circuitry coupled to the PLL.

8. The electronic system of claim 7, wherein the PLL includes:
   a fast integral path circuitry,
   a slow integral circuit path circuitry, and
   a proportional path circuitry.

9. An apparatus comprising:
   a first transistor having a gate terminal;
   a second transistor coupled in series to the first transistor, the second transistor having a gate terminal, wherein the first and second transistors are of the same conductivity type;
   a first low pass filter (LPF) to receive a power source signal from a power source and to provide a filtered version of the power source signal to the gate terminal of the first transistor; and
   a second LPF to receive a voltage divided version of the power source signal and to provide a filtered version of the voltage divided version of the power source signal to the gate terminal of the second transistor.

10. The apparatus of claim 9, wherein the first and second transistors are p-type transistors.

11. The apparatus of claim 9 further comprises a first resistor having a first terminal coupled to a node to receive the power source signal, and second terminal coupled to an input of the second LPF.

12. The apparatus of claim 11 further comprises a second resistor having a first terminal coupled the input of the second LPF, and a second terminal coupled to ground.

13. The apparatus of claim 9 further comprises:
   a first resistor; and
   a second resistor coupled in series with the first resistor, the first and second resistors forming a voltage divider to provide the voltage divided version of the power source signal to the second LPF.

14. The apparatus of claim 9, wherein the first transistor having a source terminal coupled to a node which receives the power source signal.

15. The apparatus of claim 9, wherein the second transistor having a drain terminal to provide an output power supply signal to a load.

16. The apparatus of claim 15, wherein the load is phase locked loop (PLL).

* * * * *